United States Patent [19]
Matern

[11] Patent Number: 5,877,033
[45] Date of Patent: Mar. 2, 1999

[54] SYSTEM FOR DETECTION OF UNSOLDERED COMPONENTS

[75] Inventor: Michael L. Matern, Plympton, Mass.

[73] Assignee: The Foxboro Company, Foxboro, Mass.

[21] Appl. No.: 812,903

[22] Filed: Mar. 10, 1997

[51] Int. Cl.[6] .................................................. H01L 21/00
[52] U.S. Cl. .............................. 438/14; 438/17; 438/18; 438/15; 438/615; 324/765; 324/766; 324/767; 324/768; 324/769; 257/48
[58] Field of Search ................................ 438/14, 17, 18, 438/15, 615; 257/48; 324/765–769

[56] References Cited

U.S. PATENT DOCUMENTS

| | | | |
|---|---|---|---|
| 4,091,529 | 5/1978 | Zaleckas | 29/628 |
| 5,308,928 | 5/1994 | Parla et al. | 174/261 |
| 5,637,835 | 6/1997 | Matern | 174/266 |

*Primary Examiner*—John F. Niebling
*Assistant Examiner*—David A. Zarneke
*Attorney, Agent, or Firm*—Terrence Martin; Jules Jay Morris; Sean D. Detweiler

[57] ABSTRACT

A system for detecting certain improperly soldered electrical component connections to a printed circuit board includes methods and apparatus providing an automated means for detecting unsoldered component leads is disclosed. A connection pad divided into two portions, or land areas is bridged by the component lead when soldered. A test pad connected to one of the land areas provides a test point for detecting the presence or absence of an open circuit condition through the lead of an electrical component to a point in the circuit to which it is to be electrically connected.

12 Claims, 5 Drawing Sheets

SYSTEM FOR DETECTION OF UNSOLDERED COMPONENTS

FIELD OF THE INVENTION

This invention relates to the manufacture of circuit boards, and more particularly to a system including methods and apparatus for automatic testing of solder joints of surface mounted and other electronic component lead connections. Further, solder connections of components and devices that are otherwise untestable by conventional electrical methods of circuit board testing are susceptible of testing according to the methods and apparatus forming the present system.

BACKGROUND OF THE INVENTION

The technological advances made in semiconductor processing have enhanced soldering of surface mounted electronic components to conductor pads on etched circuit boards. These circuit boards are generally known as printed circuit boards without regard to the method of forming the circuit traces on the insulating substrate. The economies of scale resulting from this advance have led to the predominance of printed circuit boards for surface mounted devices. Numerous different components and devices (collectively "components") can be surface mounted.

By placing test pads and contacts at specific electrical and/or physical board locations, most circuits and components may be tested for quality control by automated test equipment. For various reasons, certain components (including certain surface mounted components) do not lend themselves to direct electrical testing. Thus, the technology presently known is unable to provide for the electrical testing of either the component or the reliability of the solder connection(s) to it, once the soldering assembly is completed. Examples of such components include intrinsic safety components, surge suppressors, gas discharge tubes, certain semiconductors, and myriad other components. Only costly visual inspection of the connections to these components can be performed to ensure that they are properly soldered.

Occasionally, component to solder pad connections that remain unsoldered may be difficult or impossible to detect. This is especially true of the untestable components previously discussed. Often, through partial physical contact of a component lead and its respective solder pad, the component may still function sufficiently well to pass an initial electrical inspection, at least until shock, vibration, oxidation, and/or corrosion degrades the electrical contact. This defect may be difficult to detect since an intermittent electrical connection may be present when the component or circuit functionality is tested. Often, these improper contacts are very difficult to locate and identify, even under repeated visual inspection.

Automatic testing techniques typically test the electrical or electronic functionality of the components. The equipment and methods for practicing automatic testing are well known to the person having ordinary skill in the art. Automatic testing techniques are desirable since they are faster than manual testing techniques, more efficient, generally more reliable, and more cost effective. Automatic continuity/value testing cannot, however, be used with many of the foregoing special components. Often, these components cannot be electrically tested because testing would destroy the component for its intended function. However, it may still be necessary to verify the solder connection of each component lead to ensure that electrical connection is made. Presently, this inspection must be performed visually. A reliable electrical test of the connection would be preferable, especially if performed with conventional automatic test equipment and testing processes. Automated test of these special components cannot be performed at present since there is no mechanism that can test the solder connection of each lead of these components in an automated manner.

The use of test pads connected to component leads is well known. Such test pad connections provide an electrical connection point for the known automated means for testing electrical connections between various devices and for testing the component functionality. However, there is no automated mechanism directed to testing for the presence or the mechanical stability of the solder joints of individual component leads to the circuit board. When the component can be automatically tested, an unsoldered lead may go undetected if it does not affect the electrical functionality of the tested component(s) at the time of the test.

U.S. patent application Ser. No. 08/451,954, filed May 26, 1995, assigned to the assignee of the present invention, discloses a system and method for detecting unsoldered thru-hole component connections. The teaching of U.S. patent application Ser. No. 08/451,954 is hereby incorporated herein in its entirety.

In Ser. No. 08/451,954, a peripheral land area is positioned very closely circumjacent the land area of a thru-hole on one or both sides of a PC board, through which thru-hole a component lead is inserted. The circumjacent land area(s) may be connected to one or more test pads. The separation between the thru-hole land area and the circumjacent land area forms an isolation gap which is very narrow; it is easily bridged by flowing solder over the separation. Thus, application of solder to secure the components to the thru-hole land area of the PC board effectively bridges, by surface tension of the molten solder, the narrow space between the thru-hole land area and the circumjacent land area connected to the test pad. When the soldering process is completed, measurement of electrical conductivity between the test pad(s) indicates that the component lead is properly soldered on both sides of the board. No portion of the component lead is ordinarily used in bridging the gap.

U.S. Pat. No. 4,091,529 to Zaleckas illustrates a bifurcated component connect lead area on a printed circuit board, joined by the circuit board trace at a location spaced apart from the connect land area. The document does not address automated testing of unsoldered component leads.

U.S. Pat. No. 5,308,928 to Parla et al discloses a method and structure for manufacturing printed circuit board traces in which multiple land areas are formed at open areas of the board and in such close proximity to one another that an intentional interconnect can be formed between many of them by solder bridging. A multiplicity of such interconnect areas enables manufacture of a minimal number of printed circuit boards to each meet the multiple connection possibilities of multiply functional printed circuit boards. The document does not address the problem of defectively soldered component leads or automated testing of unsoldered component leads.

Accordingly, where the component is not susceptible of direct electrical testing there exists no technique for automatically detecting unsoldered component leads. Only a manually performed visual check of each such solder connection can detect such defective solder joints.

SUMMARY OF THE INVENTION

A system for detecting unsoldered component leads is disclosed. The system includes related methods for making printed circuit boards and for testing, especially automated testing, for failed solder connections. At the circuit board level, the invention consists of a specially configured component solder connection pad. A unitary connection pad is ordinarily formed at the point of board contact for each of the component leads. This pad serves to form a solderable surface for securing the component lead to the printed circuit board and for establishing an electrical connection between the component and the remaining board circuitry.

It is an object of this invention to provide a system for detecting unsoldered component leads that increases the quality assurance of the finished assembly, yet does not significantly increase the cost of the printed circuit board.

It is an object of this invention to provide a method of making printed circuit boards that enables testing of component lead soldering. It is a feature of this invention that the solder connection of component leads can be tested without subjecting the component, per se, to an electrical current.

It is an object of this invention to provide an automatic testing technique for detecting unsoldered component leads. It is a feature of this invention that the solder connections of component leads can be tested by conventional automatic testing equipment and methods, even where the components per se cannot be tested by electrical methods.

It is a further object of this invention to provide a system as described above that does not affect the existing circuit or component integrity.

A system for accomplishing the objectives of detecting unsoldered circuit board component leads according to this invention includes a circuit card having at least one surface and at least one solderable connection pad on the surface positioned to underlie a specific component lead and connected to a circuit path on the circuit card. The connection pad is separated into first and second unconnected land areas and at least one component having at least one electrical connection lead is located for solder connection to the connection pad. The land areas of the connection pad are disposed such that electrical connection between the first and second land areas is completed upon solder connection of the component lead to the respective connection pad.

One method of the present invention is directed to producing circuit cards for meeting the foregoing objectives comprises the steps of providing a circuit card substrate having at least one surface and forming at least one solderable connection pad on the surface positioned to underlie a specific component lead. The pad is divided into first and second land areas electrically isolated by a separation of the first and second land areas from one another. The separation of the first and second land areas is to be sufficient to prevent joining them by surface tension of liquid solder alone. The first land area is connected to a circuit path on the circuit card. It may also be connected to a test pad or test point.

A conventional solder paste layer, preferably having adhesive properties, is applied to portions of the surface through a mask, including the first and second land areas. A separate mask may be used to apply a plating resist in order to prevent plating thereof by a plating solution. The solder paste mask may be configured to prevent application of solder paste to the area separating the connection pad land areas. The component lead is then applied to the paste for soldering. It is held in place by the adhesive qualities of the solder paste.

Another method of the present invention relates to detecting unsoldered circuit board component leads according to these objectives includes the steps of providing at least one solderable connection pad on a surface of the circuit board including first and second land areas electrically isolated by a separation of the first and second land areas from one another. The separation of the first and second land areas is to be sufficient to prevent joining them by surface tension of liquid solder alone. The first land area is conventionally connected to a circuit path on the circuit card. It may also be connected to a test pad or other test connection point. A solder paste is applied to the connection pad, and the component lead is positioned onto and pressed into the paste, which temporarily holds the component lead in place for soldering. Again, the solder paste mask may be configured to prevent application of solder paste to the area separating the connection pad land areas. The first and second land areas are then electrically connected by soldering the component lead onto and joining the first and second land areas to form a single connection pad area. Electrically testing the continuity of the connection pad between the first and second areas then ensures detection of most defective solder faults of these split pad connections.

A method for producing circuit cards that facilitates detection of unsoldered component leads, includes the steps of providing a circuit card substrate having at least one surface, then forming at least one solderable connection pad on the surface positioned to underlie a specific component lead. The connection pad is to include first and second land areas electrically isolated by a separation of the first and second land areas from one another. The separation of the first and second land areas is to be sufficient to prevent joining thereof by surface tension of liquid solder alone. The first land area is connected to a circuit path on the circuit card. It may also be connected to a test pad or other test point.

A coating is then applied to portions of the surface to prevent plating thereof by a plating solution, including the separation between the first and second land areas. Then a plating solution is applied to areas of the surface in the absence of the solder mask, wherein the coating applied to the separation of the first and second land areas is insufficient to join them by surface tension of the plating solution. Thereafter, a solder paste layer is applied in a coating of predetermined thickness to selected areas through a mask. As before, the solder paste mask may be configured to prevent application of solder paste to the area separating the connection pad land areas. Component leads are applied to, and pressed into, the solder paste. The component leads are thereafter soldered to the board by heating the solder paste in the known manner.

In the present invention, the connection pad is formed on the circuit board in a divided state, separated into two (or more) unconnected portions, or separate land areas, by an insulating gap. The component lead electrically bridges and mechanically joins the lead to the two connection pad land areas when it is sufficiently soldered to form an acceptable joint. It is a feature of the present invention that the connection pad associated with a given component lead thus becomes a single electrical entity when the two lands are joined by the component lead soldered to the board.

This electrical connection between the land areas is used to test the continuity across the land areas of the connection pad to detect any unsoldered component leads.

It is an advantage of the present invention that testing the electrical continuity through the (at least) two land areas provides an improved test of whether the connection is properly soldered. This test may be readily adapted to conventional automated test procedures. Continuity testing may be performed directly through the bridged connection pad land areas if they are of adequate size and access is available, or through one or more test pads connected to the respective land areas by circuit paths.

Test pads may be formed on the circuit board, each pad usually being located in close proximity to one or more leads of an electrical component if it is desired to provide a conventional test pad surface to facilitate automated testing. Such test pads should be easily accessible by an automated testing apparatus. A respective test pad may be connected to only one, or to both land areas of the connection pad. Other test points may also be used.

The configuration of the separating division or gap between the first and second land areas can be embodied in various geometric shapes and sizes. However, it is preferred that emphasis be placed on a design that preserves and maintains the integrity of the main circuitry. The connection pad may also be divided into more than two land areas. Conductivity may then be checked across the entire connection pad, including through two or more land areas.

In a first configuration, the separation path of the connection pad division is to be rectilinear. That is, a straight linear separation path may be used. A series of straight paths displaced at angles to one another may also be used. In one variation, the separation path may be angled to improve the reliability of the solder bridging due to solder flow dynamics of the soldering process. This may be especially effective with certain component placement and soldering processes. The separation path of the connection pad division may also be curvilinear in additional configurations.

Additional consideration may be given to the shape, size, and disposition of the component lead to be soldered. A separation across the width of an elongated connection pad may be preferred for a lead having an elongated axial dimension, such that the long component lead ensures effective bridging of the separation gap. For certain discrete components designed especially for surface mounting to printed circuit boards and having a multiplicity of closely parallel contact leads, the connection pad land area may be lengthened along the axis of the component lead and a dividing separation gap formed normal with respect to the length of the component lead. Similarly, a wider component lead may suggest a separation normal to the width of the connection pad for a lead having a wider contact surface provided by the wider component lead. Such a configuration may also facilitate desirable positioning of a test pad.

It is generally preferred that a substantially uniform distance be maintained across the separation gap width. Due consideration should be given for etching limitations according to the pattern of the separation gap.

In any configuration, the test pad(s) may be so disposed as to provide convenient access by automated testing equipment. Thus, the present invention may be used with known automated test equipment to detect the absence or failure of a component connection to a connection pad through a failure to form a solder bridge that includes both the first and second land areas and the component lead.

Other general and specific objects, features, and advantages of this invention will be apparent and evident from the accompanying drawings and the following detailed description of the preferred embodiment.

BRIEF DESCRIPTION OF THE DRAWING FIGURES

The foregoing and other objects, features, and advantages of the invention will be apparent from the following more particular description of the preferred embodiments of the invention, as illustrated in the accompanying drawing figures in which like reference characters refer to the same elements throughout the different views. The drawings are not to scale, emphasis being placed on illustrating the principles of the invention.

DESCRIPTION OF THE PREFERRED EMBODIMENTS

Apparatus and methods for providing automated detection of unsoldered component leads is disclosed in FIGS. 1 through 6. The first side of a printed circuit board 20 corresponding to the component side is shown in all figures.

Referring now to FIGS. 1 through 4, printed circuit board 20 contains a component soldered to one or more solder pads on the surface of the printed circuit board in accordance with the present invention 10.

Figure 1:
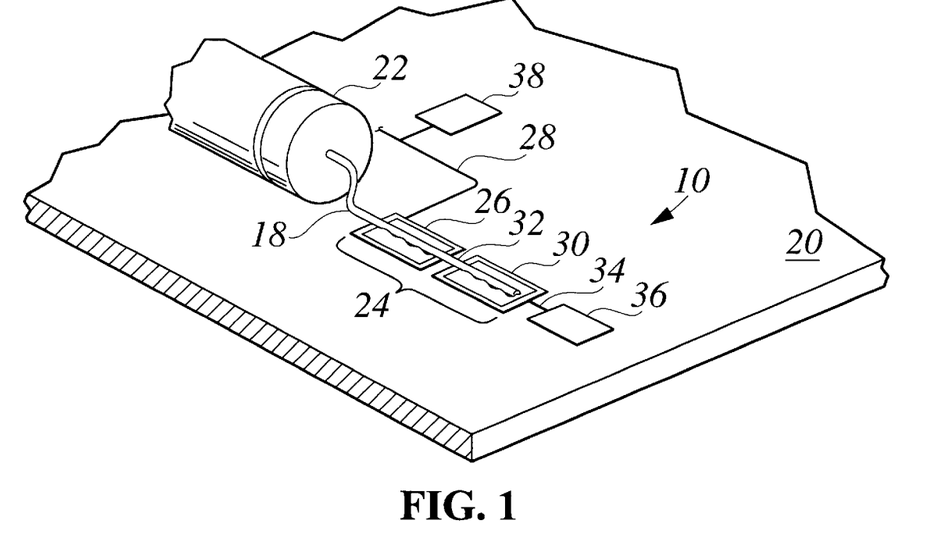
FIG. 1 is a perspective view of a portion of the surface of a printed circuit board manufactured in accordance with one embodiment of the present invention.

FIG. 1 shows a test pad land area or etch 36 is positioned within close proximity to a component pad 24 composed of electrically separated land areas 26 and 30. The test pad 36 can be used by an automatic testing device to test the electrical connection between a lead 18 extending from component 22 and the test pad 36 once the lead 18 is soldered to both of the land areas 26, 30 that form the component connection pad 24 on the printed circuit board 20. The presence of an electrical bridging connection 32 between the first and second land areas of the connection pad 24 is used to indicate that the lead 18, and thus component 22, is successfully soldered to the printed circuit board 20.

In the first embodiment shown in FIG. 1, connection pad 24 is composed of first and second land areas 26, 30 joined by the bridging component lead portion 32 and then via conductive trace 34 to the test pad 36. The portion 32 of the lead 18 serves to form an electrical connection bridge between the first and second land areas to test pad 36 in order to enable tests of the connection pad 24 connection at 32 with conventional automated test equipment. The respective land areas 26, 30 and the test pad 36 can be formed of any conventional conductive material such as copper, that is preferably covered with a layer of solder or solderable plating or the like before mounting the components. Another test pad 38, such as is ordinarily used for testing at the component lead end, may be connected via path 28 to the connection pad 24 first land area 26.

Figure 2:
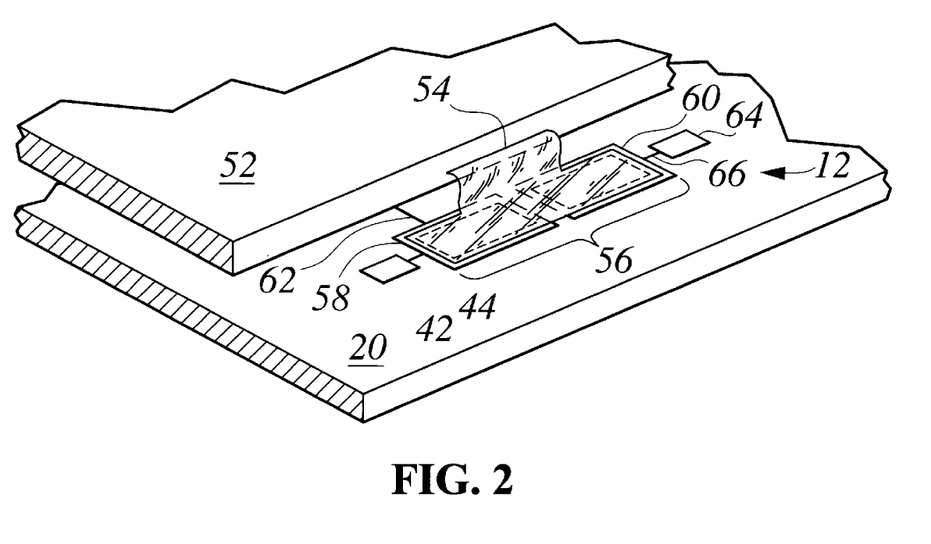
FIG. 2 is another perspective view of a printed circuit board manufactured in accordance with the present invention, illustrating a wide component lead soldered to a wide connection pad divided along its width, and further illustrating a variation of the embodiment illustrated in FIG. 1.
Figure 3:
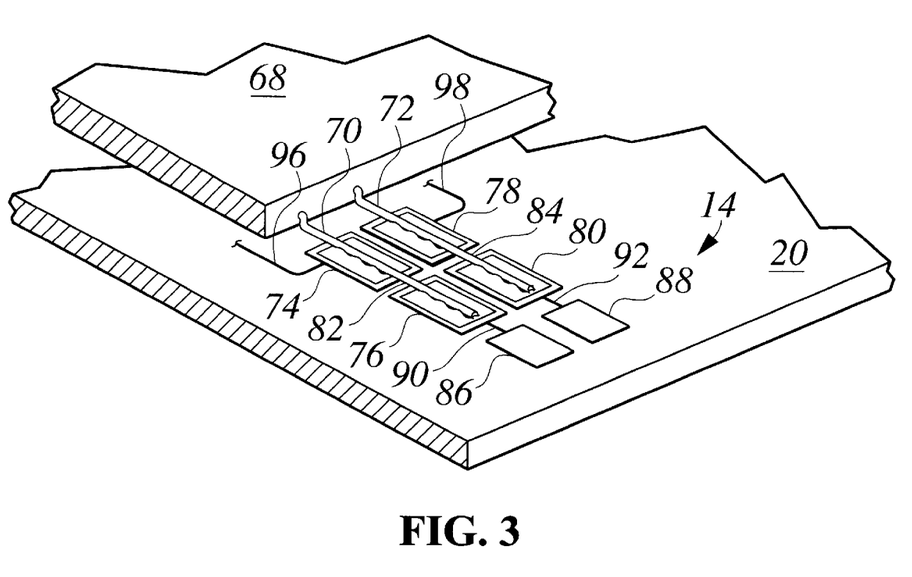
FIG. 3 is another perspective view of a printed circuit board manufactured in accordance with another connection pad configuration of the present invention, illustrating a component having plural leads soldered to plural connection pads.
Figure 4A:
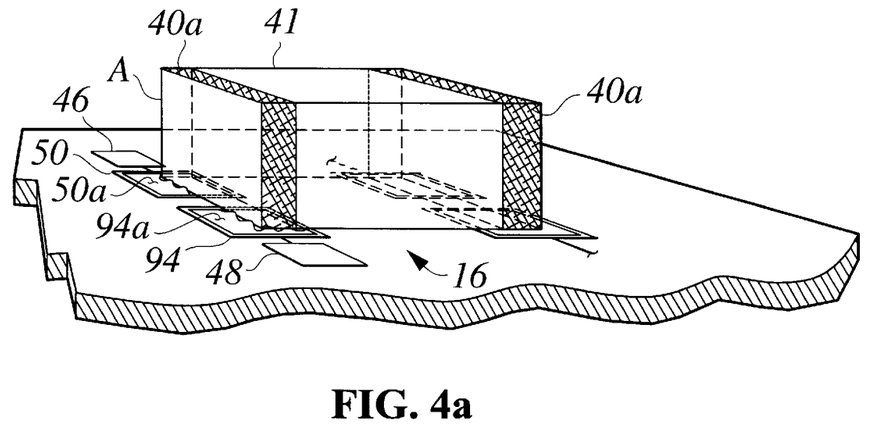
FIGS. 4A an 4B are side views of a discrete component soldered to the printed circuit board, FIG. 4 illustrating an embodiment for testing such discrete component solder connections to a printed circuit board.
Figure 4B:
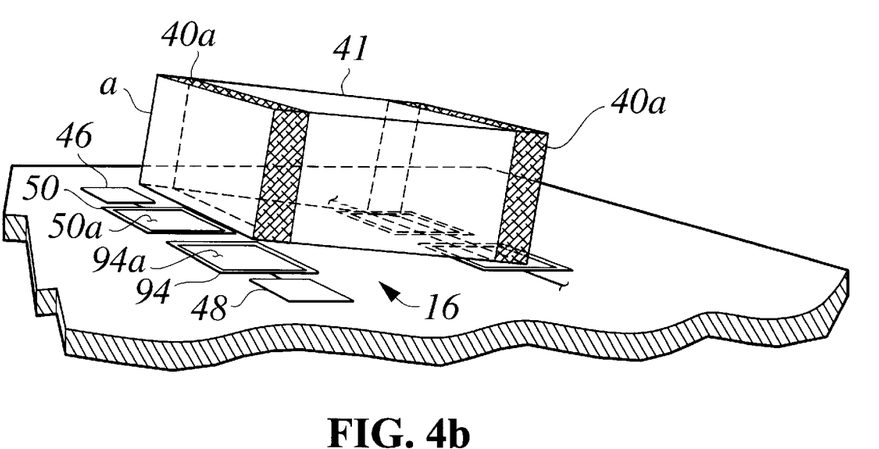

Solder in the form of a paste 40 may be used to join the component leads to the land area portions. This is especially so for chip type and other surface mount components such as shown in FIGS. 2–4 (solder paste 40 not shown in FIGS. 1–3). The solder paste typically includes entrained microcapsules of solder distributed throughout a sticky flux. Kester Corp. type R244 solder paste, catalog number 58-3301-1601-NS is believed suitable. AIM type SN 63_NC291AX_90-75-70 may also be used. Heating the solder paste melts the solder 40 therein and causes it to flow, joining the component leads (e.g., 18, etc.)to the land areas 26, 30, etc.) Alternately, solder may be applied by other methods known to those persons having ordinary skill in the art.

The separation distance between land areas 26 and 30 should be selected to provide for at least a minimal spacing value over a non-conductive material to avoid unintentional solder bridging. A mask of insulating material that resists solder bridging may be used to enhance the spacing. The spacing and mask material are selected with due consideration given to standard circuit board preparation and processing techniques. This spacing can be accomplished over any insulating substrate material such as conventional circuit board material 20. The narrower is the spacing, the easier it is to form the conductive solder bridge with lead 18 during component 22 installation. However, the spacing must also be wide enough to reliably electrically isolate the two land areas 26, 30 before soldering the component 22 lead 18 to those land areas. That is, the spacing must be great enough to eliminate liquid solder bridging due to surface tension, capillary action, or the like without the presence of lead 18.

A preferred spacing for most surface mount components ranges to no more than about 0.030 inches, and preferably from about 0.005 to about 0.006 inches. It is believed that selection from among the many solder paste products available, and especially that both the area and layer thickness of the solder paste, will affect the soldering process due to surface tension of the molten solder and/or capillary action. These factors must also be considered in determining an appropriate spacing. However, the invention as broadly claimed is not to be interpreted as being limited to any particular land area spacing dimension. The choice of spacing dimensions, paste area, and paste thickness are preferably based on the paste material used, manufacturing considerations such as cost of manufacture, and the ease in forming a solder bridge with component lead 18 with the selected solder process.

It is believed that a solder paste area which is great enough to substantially cover each land area is sufficient in combination with a layer thickness ranging from about 0.002 to about 0.012 inches, and preferably ranging from about 0.006 to about 0.008 inches. As layer thickness and/or volume of paste applied to each pad increases, it may become increasingly necessary to provide a separation of masked solder paste areas generally conforming to the separation between land ares.

The exposed surface area of each of the land areas 26, 30 should be large enough to form a solder bridge while not requiring a large amount of circuit board space or a particularly large cross section of component device lead 18. A width between about 0.0125 to about 0.015 inches may be preferred for most discrete component leads. However, the invention as broadly claimed is not to be interpreted as being limited to any particular connect pad or component lead size. Rather, the emphasis is normally placed on conserving circuit board space, on ensuring adhesion of the component lead in the solder paste, the ease and reliably in formation of the solder bridge 32, and the ease with which automated testing can thereafter be carried out. Of course, with wide component leads (see FIG. 2), wide connection pad land areas may be desired.

Test pad 36 and circuit path 34 are used in connection with circuit path 28 by a conventional automatic testing device to detect electrical connections through land areas 26, 30 forming connection pad 24, through the portion 32 of the component lead 18 that bridges the land areas. Typically, conventional automatic testing equipment can test the electrical conductivity of connections relative to two land areas of predetermined positions, that are usually conventional test pads. Test pad 38 is connected via path 28 to the connection pad 24 first land area 26; it provides a test pad to test pad circuit path for testing the solder bridge 32.

Test pads 36, 38 can be of a square, rectangular, circular, or other shape and are normally formed of a conductive material such as copper. The pads are preferably covered with a layer of solder or plating. They should be sized large enough to enable reliable contact by the automatic test equipment test probes. However, they need not be limited to a particular size, geometric shape, or plating layer. Other shapes and plating materials may be used so long the resulting test pads 36, 38 are suitable for the automatic testing device employed. Other electrically conductive configurations may also be used in place of the printed circuit board test pads, such as (but not limited to) test point pins and terminals, connectors, and the like. The geometric shape or size of conductive traces 28, 34 should be selected to provide at least the minimum electrical conduction path needed to form the electrical connection between test pad 38, land areas 26, 30, and test pad 36.

Using current printed circuit board technology, conductive trace 34 can be formed of a conductive material such as copper and may be covered with a protective layer of non-conductive mask material if desired. Any solder mask material may be used. This mask is used primarily to ensure that solder does not form about the conductive trace during the soldering process. As discussed above, care should be exercised in the selection of the solder paste used, and more particularly, in the thickness of the solder paste layer and the area(s) covered.

The system is advantageously applied to wide connection pads 12 as well, as is illustrated in FIG. 2. A component 52 is mounted to circuit board 20 via a wide component lead 54 and soldered to a divided wide connection pad 56. The solder paste 40 (not shown) stickiness may be reliably used to hold the component lead 54 to the connection pad 56 until soldering is completed.

Pad 56 is formed of separate land areas 58 and 60. When properly soldered, lead 54 electrically connects land areas 58 and 60. A normal circuit path 62 is completed between first land area 58 and another circuit portion. A test pad 42 may be connected to land area 58 through a circuit path 44 when the land area 58 is not otherwise easily accessible by the automatic electrical testing equipment. Second land area 60 is electrically connected to test pad 64 through circuit path 66. Wide connection pad land areas may be essential in some applications, e.g., where they are used for ground planes, thermal dissipation, or greater current carrying capability.

In FIG. 3, selected portions of a multiple lead component device such as an IC chip are shown soldered to a printed circuit board 20. An electrical component 68 having one or more leads 70, 72, . . . , " is placed onto the printed circuit board 20 from the component side with the leads 70, 72 stuck to the respective connection pads by solder paste 40

(not shown). The leads are positioned to join the respective pairs of land areas 74, 76 and 78, 80. Each lead is then soldered (by heating the solder paste) to the board 20 to thereby secure the lead to the printed circuit board. Typically, a good solder connection will result in solder flowing so that a respective solder bridge 82 is formed together with each lead 70, 72 across the respective gap between the two land areas 74, 76 and 78, 80 that form each completed connection pad to bridge the spacing. The bridge electrically connects the first and second land area portions of the connection pad. Circuit paths 90, 92 lead to the respective test pads 86, 88. The additional soldering should not ordinarily require any increase in the manufacturing time of the printed circuit board. It provides a system for testing the connection between the respective test pads 86, 88 and the respective land area pairs 74, 76 and 78, 80 that are joined electrically by the leads 70, 72. The bridging of the separated land areas enables the connection of the individual lead 70, 72 to the printed circuit board 20 to be tested, and especially by known automatic testing equipment using test pads 86, 88 and circuit paths 96, 98. This conductivity test will detect the presence of any unsoldered leads.

It should be noted that the invention disclosed herein greatly enhances the reliability of the printed circuit boards at reduced cost by testing for electrical continuity between the land areas of selected component connection pads. However, the reliability of the continuity tests may be defeated by component leads that are not, in fact, properly soldered to their respective connect pads. Additional certainty can be obtained by dividing the connect pad into a greater number of land areas and testing continuity among all of them. For example, the connect pad can be divided into first, second, and third land areas (not shown) in which the component lead is soldered to all three land areas. Continuity can be tested from a center, or second land area that is positioned between outer first and third land areas. Testing the continuity to land area two through land areas one and three, all connected by a soldered component lead bridge, will enhance reliability where a greater level of connection certainty is required.

A discrete component 41 adapted for surface mounting by a solder paste to the printed circuit board 20 is illustrated in FIGS. 4A and 4B, another embodiment 16 for testing discrete component solder connections to printed circuit board pads 50, 94 via conventional test pads 46, 48. Solder pads 50, 94 represent land areas, separated by a narrow isolation region. Bands of conductive solderable material 40A as known in the art are formed on the ends of component 41 for soldering to the printed circuit board 16 through the medium of the masked solder paste 50A, 94A areas on the connection pads 50, 94. The pads 50, 94 are of smaller area than a conventional surface mount component 41 pad area in order to provide for the separation therebetween. Each side of a given end of the band 40A is disposed over one of the respective pads 50, 94. Together, they form a conventional pad when bridged by both sides of the one end of the component 41 solderable material 40A band.

The "popcorn" effect arises when a surface mount component 41 is not soldered substantially flush and square with the printed circuit board 20. Component 41 is correctly soldered as shown in FIG. 4A. In FIG. 4B, component 41 is shown improperly soldered to the board, with one end unconnected. This is characteristic of the "popcorn" effect. In FIG. 4B, the band 40A typically does not connect pads 50, 94; that is, the conductive bridge between pads 50, 94 is missing in this position.

The presence or absence of the component 41 soldered to both the pads 50, 94 is detected conventionally by the presence or absence of a low resistance path from a test pad 46, solder pad 50, solder 50A, through the component 41 end band 40A, solder 94A, and solder pad 94 to test pad 48. When the path is incomplete, the connection of component 41 to pads 50, 94 cannot be assumed.

Figure 5:
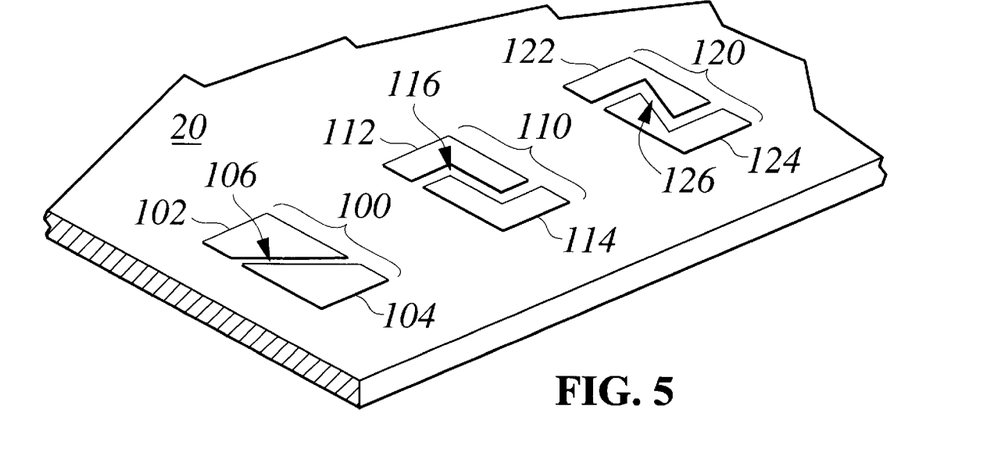
FIG. 5 is another perspective view of a printed circuit board illustrating several connection pad configurations having rectilinear separation gaps.
Figure 6:
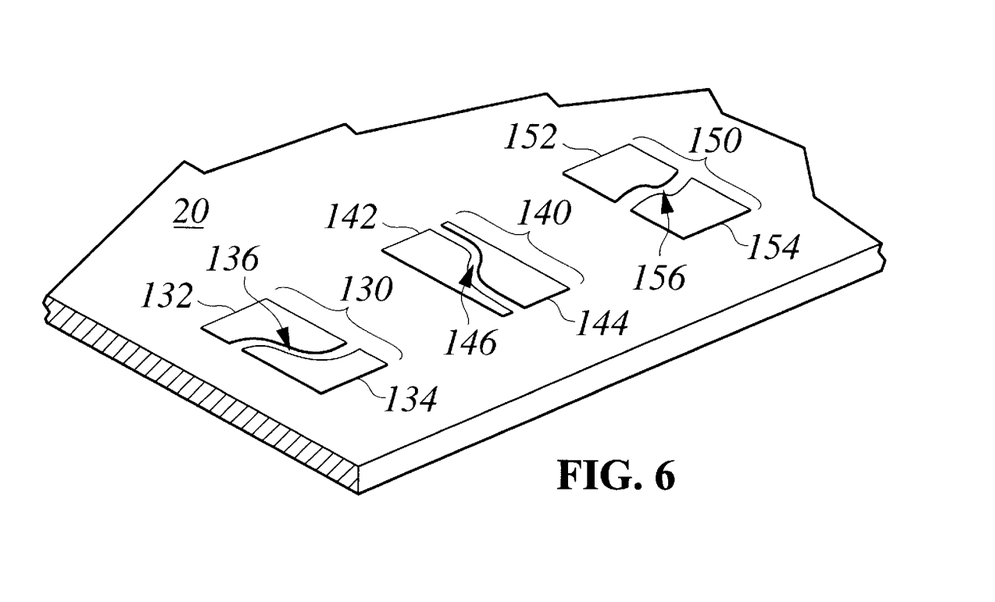
FIG. 6 is another perspective view of a printed circuit board illustrating other connection pad configurations having curvilinear separation gaps.

Turning now to FIGS. 5 and 6, a number of examples are shown of useful patterns for the connect pad land areas on the printed circuit board 20. In FIG. 5, for example but not limitation, several linear gap geometric patterns 100, 110, and 120 are shown. Curvilinear separation gap patterns are shown in FIG. 6. The solder paste (not shown in FIGS. 5 and 6) is applied over these connect pad land areas to secure the component leads until soldering is completed.

Connect pad 100 includes first and second land areas 102, 106 diagonally separated by a narrow gap 106 that also cannot be bridged by surface tension of molten solder. Connect pad 110 includes first and second land areas 112, 114 rectilinearly separated by gap 116, that also cannot be bridged by surface tension of molten solder. The component lead (not shown) normally extends along the central portion, or spine, of the pad 110. However, when the component lead does not fall along the spine, a bridge may be formed anywhere along the gap 116 between the two land areas 112, 114. Similarly, connect pad 122 includes first and second land areas 122, 124 rectilinearly separated by a partially diagonal gap 126, that again cannot be bridged by surface tension of molten solder. While the component lead (not shown) normally extends along the central portion, or spine, of the pad 120, when the component lead does not fall along the spine, a bridge may be formed anywhere along the gap 126 between the two land areas 122, 124; it is highly likely that the diagonal portion of gap 126 will be bridged.

The curvilinear gaps 136, 146, and 148 are selected to ensure that the component lead (not shown) to be soldered to the printed circuit board 20 bridges the gap 136, 146, or 148, between the respective land area pairs 132, 134; 142, 144; and 152, 154, thus allowing for great variance in lead placement which will reliably connect to connect pads 130, 140, or 150, respectively.

The aforementioned disclosure presents a method and apparatus providing an automated system for detecting the presence of unsoldered component device leads.

Although the preferred embodiments of the invention have been described hereinabove in detail, it is desired to emphasize that this description is provided for the purpose of illustrating particular embodiments of the invention and thereby to enable those skilled in the art to adapt the invention to various different applications that may require modifications to the apparatus described hereinabove. Thus, the specific details of the disclosed embodiments illustrated herein are not intended as limitations on the scope of the present invention other than as required by such prior art teachings as may be found pertinent to this invention.

What is claimed:

1. A method for producing circuit cards that facilitates detection of unsoldered component leads, comprising the steps of:

a) providing a circuit card substrate having at least one surface;

b) forming at least one solderable connection pad on the surface positioned to underlie a specific component lead the pad including first and second land areas electrically isolated by a separation of the first and second land areas from one another, wherein the separation of the first and second land areas is sufficient to prevent joining them by surface tension of liquid solder alone and the first land area is connected to a circuit path on the circuit card;

c) applying a solder mask to portions of the surface, including the separation between the first and second land areas, to prevent plating thereof by a plating solution;

d) applying a plating solution to areas of the surface in the absence of the solder mask; wherein the solder mask applied to the separation of the first and second land areas is sufficient to prevent joining them by surface tension of the plating solution;

e) joining at least once component having a plurality of electrical connection leads, each located for solder connection to a respective connection pad on the surface, to the respective connection pad by soldering;

f) electrically testing the continuity of the connection pad between the first and second land areas.

2. The method of claim 1, further including the step of applying a solder paste layer to at least a portion of respective connection pads, said solder paste layer having a thickness in a range of from about 0.002 to about 0.012 inches.

3. The method of claim 1, further including the steps of:

(e) forming a plurality of test pads, each joined by a respective circuit path electrically connecting the second land area to a respective test pad; and (g) electrically testing the electrical continuity between the first and second land areas of the respective connection pad through the respective test pad.

4. The method of claim 1, wherein the first and second land areas are positioned to underlie subsequent placement of a specific component lead.

5. A method of detecting unsoldered circuit board component leads, comprising the steps of:

(a) providing at least one solderable connection pad on a surface of the circuit board positioned to underlie a specific component lead and including first and second land areas electrically isolated by a separation of the first and second land areas from one another, wherein the separation of the first and second land areas is sufficient to prevent joining them by surface tension of liquid solder alone, and the first land area is connected to a circuit path on the circuit card;

(b) electrically connecting the first and second land areas by soldering a component lead onto and joining the first and second land areas to form a single connection pad area; and (c) electrically testing the continuity of the connection pad between the first and second areas.

6. The method of claim 5, further including the step of:

(d) applying a solder paste layer to at least a portion of respective connection pads, said solder paste layer having a thickness in a range of from about 0.002 to about 0.012 inches, and step (b) is thereafter accomplished by heating of the solder paste until it melts.

7. The method of claim 5, further including the step of:

(d) providing a plurality of test pads, each of respective test pads being joined by a respective circuit path electrically connected to a respective second land area;

and thereafter in step (c) electrically testing the continuity of the connection pad between the first and second land areas through said test pad area.

8. A method for producing circuit cards that facilitates detection of unsoldered component leads, comprising the steps of:

a) providing a circuit card substrate having at least one surface;

b) forming at least one solderable connection pad on the surface positioned to underlie a specific component lead the pad including first and second land areas electrically isolated by a separation of the first and second land areas from one another, wherein the separation of the first and second land areas is sufficient to prevent joining them by surface tension of liquid solder alone and the first land area is connected to a circuit path on the circuit card;

c) applying a coating to portions of the surface to facilitate plating thereof by a plating solution, including the separation between the first and second land;

d) applying a plating solution to areas of the surface in the absence of a solder mask; wherein the coating applied to the separation of the first and second land areas is sufficient to prevent joining them by surface tension of the plating solution;

e) joining at least one component having a plurality of electrical connection leads, each located for solder connection to a respective connection pad on the surface, to the respective connection pad by soldering;

f) electrically testing the continuity of the connection pad between the first and second land areas.

9. The method of claim 8, further including the step of:

(e) applying a solder paste layer to at least a portion of respective connection pads, said solder paste layer having a thickness in a range of from about 0.002 to about 0.012 inches, and then (f) heating the solder paste until it melts and flows.

10. The method of claim 9, wherein the solder paste is divided along the separation of the first and second land areas.

11. The method of claim 9, wherein the solder paste is applied in a layer having a thickness in a range of from about 0.006 to about 0.008 inches.

12. The method of claim 9, wherein the solder paste is applied in a layer having a volume sufficient to join the component lead to the connection pad and insufficient to bridge the separation of the first and second land areas in the absence of the component lead.

* * * * *